United States Patent [19]

Gonya et al.

[11] Patent Number: 5,368,814
[45] Date of Patent: Nov. 29, 1994

[54] LEAD FREE, TIN-BISMUTH SOLDER ALLOYS

[75] Inventors: Stephen G. Gonya; James K. Lake, both of Endicott, N.Y.; Randy C. Long, Friendsville, Pa.; Roger N. Wild, Owego, N.Y.

[73] Assignee: International Business Machines, Inc., Armonk, N.Y.

[21] Appl. No.: 79,064

[22] Filed: Jun. 16, 1993

[51] Int. Cl.$^5$ .............................. C22C 30/02
[52] U.S. Cl. ..................... 420/587; 420/577
[58] Field of Search ............ 420/559, 561, 562, 577, 420/580, 587, 589; 148/400, 442, 419; C22C 12/00, 13/02, 30/00

[56] References Cited

U.S. PATENT DOCUMENTS

| | | | |
|---|---|---|---|
| 3,607,253 | 9/1971 | Cain | 420/562 |
| 4,083,718 | 4/1978 | Murabayashi et al. | 420/559 |
| 4,236,922 | 12/1980 | Michl et al. | 420/561 |
| 4,643,875 | 2/1987 | Mizuhara | 420/502 |
| 4,667,871 | 5/1987 | Mizuhara | 228/122 |
| 4,778,733 | 10/1988 | Lubrano et al. | 428/647 |
| 4,797,328 | 1/1989 | Boehm et al. | 428/621 |
| 4,806,309 | 2/1989 | Tulman | 420/562 |
| 4,929,423 | 5/1990 | Tucker et al. | 420/561 |

OTHER PUBLICATIONS

Journal Environmental Science, A26(6), 911–929 (1991) K. S. Subramanian et al "Leaching Of Antimony, Cadmium, Copper Lead, Silver, Tin and Zinc From Copper Piping With Non-Lead-Based Soldered Joints".

*Primary Examiner*—Richard O. Dean
*Assistant Examiner*—Sean Vincent
*Attorney, Agent, or Firm*—Richard M. Goldman

[57] ABSTRACT

The lead free alloy is a low solidus temperature, multicomponent solder alloy containing at least about 50 weight percent Bi, up to about 50 weight percent Sn (basis total Sn and Bi), and an effective amount of a physical and mechanical property enhancing third component. The third component can be Cu, In, Ag, and combinations of Cu and Ag.

2 Claims, No Drawings

LEAD FREE, TIN-BISMUTH SOLDER ALLOYS

FIELD OF THE INVENTION

The invention relates to lead free solders and especially to lead free, tin-bismuth solder alloys. These alloys are low toxicity solder alloys that are particularly useful in microelectronic applications. The solder alloys of the invention are particularly useful in joining integrated circuit chips to chip carriers and substrates, as printed circuit boards, joining chip carriers to substrates, and joining circuitization lands and pads in multilayer printed circuit boards.

BACKGROUND OF THE INVENTION

Soldering is a low temperature, generally reversible, metallurgical joining process. Low temperature and reversibility are especially important in electronics applications because of the materials involved and the necessity for reworking and making engineering changes.

Solder joining is a wetting process followed by a chemical reaction. Molten solder wets selectively. The selective wettability of solders allow molten solder to be confined to desired sites. This is especially important in flip chip bonding, and in working with solder masks.

The soldering process can be accomplished as quickly as the wetting takes place, for example, on the order of a few seconds. This makes soldering particularly desirable for automated, high speed, high throughput processes.

Wettability is also a function of the materials to be joined, with Cu, Ni, Au, and Pd, as well as alloys rich in one or more of these metals, being particularly amenable to soldering.

The chemical reaction following wetting is between the molten solder and the joining metallurgy to form an intermetallic phase region at the interface. The intermetallic phases formed by solders in electronic packaging are stoichiometric compounds, typically binary compounds, and typically containing Sn if Sn is present in the solder alloy. When the base, pad, or land is Cu, and the solder alloy is rich is Sn, the intermetallic formed during soldering is Cu—Sn. Exemplary Cu—Sn binaries include $Cu_3Sn$ and $Cu_6Sn_5$.

Solder alloys are characterized by the melting temperature being a strong function of composition. While a pure metal is characterized by a single, invariant, melting temperature, the freezing and melting points of alloys are complex. The freezing point of an alloy is determined by the liquidus line. Above the liquidus line only a liquid phase or phases can exist. The melting point of an alloy is determined by the solidus line. Below the solidus line only a solid phase or phases can exist. In the region between these two lines, i.e., between the liquidus line and the solidus line, solid and liquid phases can co-exist.

The preferred soldering alloys are eutectics, that is, they are characterized by a eutectic point. The eutectic point is where the liquidus and solids lines meet. A concentration change in either direction from the eutectic results in an increase in the liquidus temperature.

The composition, and the quench rate, also determine the microstructure and the resulting mechanical properties of the solder joint. Thus, it is necessary to both carefully choose the solder composition and to carefully control the thermal exposure of the soldered joint.

A solder composition used in electronics fabrication must be wettable as a solder alloy, and have at least one component capable of forming an electrically conductive, thermally stable, non-brittle, plastic intermetallic with the pad or land metallurgy. For this reason, the most common solder alloys are lead based alloys, as Sn—Pb alloys.

Heretofore, Pb/Sn solders have been utilized for electronic applications. There have been many historical reasons for the wide spread use of Pb/Sn alloys. These historical reasons include the low solidus temperature of Pb/Sn solder alloys, the workability of Pb/Sn alloys and of the resulting Cu/Sn intermetallics (formed at the solder/Cu contact interface) over a wide temperature range, the adhesion of Cu/Sn intermetallics obtained from Pb/Sn alloys to Cu lands and pads, and the ready availability of process equipment and low cost adjuncts, as resins, fluxes, and solder masks, for Pb/Sn alloys.

The relatively low temperatures required for processing Pb/Sn solder alloys are particularly important when polymeric dielectrics are used in the fabrication of electronic packages. These polymers can degrade in high temperature assembly operations. Solder alloys which melt at relatively low temperatures can accommodate these polymeric substrates.

Additionally, semiconductor chips are subject to thermal diffusion and structural transformations at elevated temperatures. Low melting solders avoid these problems.

Especially important is the "softness" or plasticity of lead based solders. This softness or plasticity allows the solder to accommodate the mismatch in coefficients of thermal expansion between the bonded structures, for example the mismatch in coefficient of thermal of thermal expansion between a ceramic dielectric and a polymeric dielectric, or between a semiconductor chip and a ceramic or polymeric chip carrier or substrate.

However, lead is a toxic, heavy metal with a relatively high vapor pressure. Its use is disfavored, and a need exists for a replacement.

Exemplary lead-free alloys are described, for example in EP 0-354-570-A2 to A. J. G. Strandjord, R. L. Yates, and D. J. Perettie for OPTICAL INFORMATION STORAGE MEDIUM which describes an optical data storage media containing an alloy of 40–85% Sn, 10–50% Bi, 1–15% Cu.

Lead free solder alloys are disclosed in, for example U.S. Pat. No. 4,929,423 to K. L. Tucker and U. Ma for LOW TOXICITY ALLOY COMPOSITIONS FOR JOINING AND SEALING which describes a lead free solder alloy for joining and sealing, disclosed to be useful as a plumbing alloy. The disclosed alloy contains 0.08–20% Bi, Cu, Ag, P, Rare Earth, and balance (ca. 80%) Sn Seraphim, Lasky & Li, *PRINCIPLES OF ELECTRONIC PACKAGING*, shows, at Table 19.1, a lead free alloy containing 58% Bi and 42% Sn.

However, the above alloys fail to provide a lead free solder that flows at low enough temperatures to avoid damage to electronic materials, wets the bonding metallurgy typically used in electronics fabrication, e.g., Cu, Au, Ag, and Pd, especially while avoiding wetting organic materials as substrates and solder masks.

OBJECTS OF THE INVENTION

It is a primary object of this invention to provide a lead free solder.

It is a further object of this invention to provide a lead free solder that wets and forms a chemically and thermally stable intermediate the bonding metallurgy typically used in electronics fabrication, e.g., Cu, Au, Ag, and Pd, especially while avoiding wetting organic materials as substrates and solder masks.

It is a further object of this invention to provide a lead free solder having that flows at low enough temperatures to avoid damage to electronic materials.

SUMMARY OF THE INVENTION

These and other problems of prior art solder compositions are overcome by the lead free solders of the present invention. The solder compositions disclosed herein are low solidus temperature, multi-component solder alloys. The principal metals in the alloy are Bi and Sn.

In a preferred embodiment of the invention, the low solidus temperature, multi-component solder alloy has major portions of Bi, and Sn, and an effective amount of a physical and mechanical property enhancing third component. The physical and mechanical property enhancing third component may be In, Cu, Ag, or combinations thereof.

In an alternative embodiment of the invention the alloy contains at least about 50 weight percent Bi, up to about 50 weight percent Sn, and an effective amount of a physical and mechanical property enhancing third component. The third component may be In, Cu, Ag, or a combination thereof, as Cu and Ag.

DETAILED DESCRIPTION OF THE INVENTION

According to the invention there is provided a family of lead-free, Sn—Bi solders. These solders are characterized by a low solidus temperature. The principal metals in the alloy are Bi and Sn.

In a preferred embodiment of the invention, the low solidus temperature, multi-component solder alloy has major portions of Bi, and Sn, and an effective amount of a physical and mechanical property enhancing third component. The physical and mechanical property enhancing third component may be In, Cu, Ag, or combinations thereof.

In a particularly preferred exemplification of the invention, the solidus lowering third component is a mixture of Ag and Cu. One Bi—Sn—Cu—Ag alloy composition contains about 46 weight percent Bi, about 48 weight percent Sn, (i.e., at least about 50 weight percent Sn, and less then 50 weight % Bi, basis total Bi and Sn), about 4 weight percent Cu and about 2 weight percent Ag.

In an alternative embodiment of the invention the alloy contains at least about 50 weight percent Bi, up to about 50 weight percent Sn, and an effective amount of a physical and mechanical property enhancing third component. The third component may be In, Cu, Ag, or a combination thereof, as Cu and Ag.

In one exemplification of this embodiment the solidus lowering third component is Cu. One preferred alloy is 48–56 weight percent Bi, 42–48 weight percent Sn and 2–4 weight percent Cu.

In an alternative exemplification of this embodiment, the solidus lowering third component is In. A preferred Bi—Sn alloy is one containing about 56 weight percent Bi, about 42 weight percent Sn, and about 2 weight percent In.

These compositions are summarized in the Table below:

| Component | Range (weight %) |
|---|---|
| Sn | 42–50 weight % |
| Bi | 46–56 weight % |
| Optional Component | Range (weight %) when present |
| Cu | 2–4 weight % |
| In | 1–2 weight % |
| Ag | 1–2 weight % |

According to one preferred embodiment of the invention there is provided a method of electrically connecting an integrated circuit chip to a circuitized substrate. This interconnection method includes the step of depositing a solder alloy comprising major portions of Bi, and Sn, and an effective amount of a physical and mechanical property enhancing third component. The physical and mechanical property enhancing third component may be In, Cu, Ag, or combinations thereof. This alloy is deposited onto electrical contacts of the integrated circuit chip. The solder alloy may be applied by wave solder deposition, electrodeposition, or as a solder paste.

The electrical leads of the circuitized substrate are then brought into contact with the solder alloy on the electrical contacts of the integrated circuit chip. Where the chip is to be mounted in a "flip chip" conformation, the current leads of the circuitized substrate are pads on the substrate, and the solder alloy deposits are brought into contact with the pads. Alternatively, where the integrated circuit chip is mounted right side up, the current leads are wire leads, and tab inner lead connections, and they are brought into contact with the solder alloy contacts on the top surface of the integrated circuit chip.

While the substrate current leads and the solder deposits are maintained in contact the solder alloy is heated to cause the solder alloy to wet and bond to the electrical leads of the circuitized substrate. Heating may be by vapor phase reflow, infrared reflow, laser reflow, or the like.

The resulting microelectronic circuit package of the invention is an integrated circuit chip module with a circuitized chip carrier, i.e., a substrate, a semiconductor integrated circuit chip, and an alloy formed of major portions of Bi, and Sn, and an effective amount of a physical and mechanical property enhancing third component, which may be In, Cu, Ag, or combinations thereof, as an electrical solder bond interconnection between the circuitized chip carrier and the semiconductor integrated circuit chip.

EXAMPLE

The invention may be understood by reference to the following example.

A series of 48 weight percent Sn-52 percent Bi solder alloys were prepared and tested for various solder properties.

In one test the solder alloys were prepared and tested for liquid-solid digestion properties. In a test of Cu digestion the Cu digested 0.35 mils into the liquid solder in 120 seconds. In another test of liquid-solid digestion, the IMC thickness measured after 100 hours at 120 degrees Celsius was 110.

In another test the alloys were tested at 80 degrees Celsius under a load of 200 psi to determine their compression creep properties. The compression strength of a 0.006 inch diameter solder ball after 40 hours in second stage creep was 0.47.

The tensile strength was measured to be 99 (100 lbs/sq. inch), the yield strength was measured to be 83 (100 lbs/square inch), and the percent elongation was measured to be 43 percent, all at 0.05 inch per minute. The tensile strength was measured to be 67 (100 lbs/sq. inch), the yield strength was measured to be 51 (100 lbs/square inch), and the percent elongation was measured to be 54 percent, all at 0.002 inch per minute. This indicates good high strength properties relative to eutectic Pb/Sn.

The alloys were also tested for cycle fatigue at 4.3 percent deflection at 23 degrees Celsius. Failure occurred after 3 cycles (five cycles per minute) and 8 cycles (1 cycle per minute).

The melting point of the alloy was measured to be 138 degrees Celsius.

While the invention has been described with respect to certain preferred embodiments and exemplifications, it is not intended to limit the scope of the invention thereby, but solely by the claims appended hereto.

We claim:

1. A low solidus temperature, multicomponent solder alloy consisting essentially of 56 weight percent Bi, 42 weight percent Sn, and 2 weight percent In.

2. A low solidus temperature, multicomponent solder alloy consisting essentially of 46 weight percent Bi, 48 weight percent Sn, 4 weight percent Cu and 2 weight percent Ag.

* * * * *